United States Patent
Miyawaki et al.

(10) Patent No.: US 7,108,399 B2
(45) Date of Patent: Sep. 19, 2006

(54) LIGHT SOURCE UNIT

(75) Inventors: Hiroshi Miyawaki, Wakayama (JP);
Masayuki Tamai, Wakayama (JP);
Ryohei Yamashita, Wakayama (JP)

(73) Assignee: Noritsu Koki Co., Ltd., Wakayama-ken (JP)

( * ) Notice: Subject to any disclaimer, the term of this patent is extended or adjusted under 35 U.S.C. 154(b) by 104 days.

(21) Appl. No.: 10/789,003

(22) Filed: Feb. 27, 2004

(65) Prior Publication Data

US 2004/0179359 A1  Sep. 16, 2004

(30) Foreign Application Priority Data

Feb. 28, 2003  (JP) .............. 2003-052629

(51) Int. Cl.
*F21V 29/00* (2006.01)
(52) U.S. Cl. .............. 362/294; 362/92; 362/230; 315/115
(58) Field of Classification Search ............. 362/555, 362/800, 315, 276, 802, 284, 373, 249, 92, 362/294; 257/705, 706, 717–720; 361/676–678, 361/695–697, 703, 709, 712, 713; 315/112, 315/115, 117, 118
See application file for complete search history.

(56) References Cited

U.S. PATENT DOCUMENTS

| | | | | |
|---|---|---|---|---|
| 4,896,168 A | * | 1/1990 | Newman et al. | 347/245 |
| 5,150,016 A | * | 9/1992 | Sawase et al. | 315/294 |
| 5,870,128 A | * | 2/1999 | Yazawa et al. | 347/130 |
| 2004/0120156 A1 | * | 6/2004 | Ryan | 362/373 |

FOREIGN PATENT DOCUMENTS

| | | |
|---|---|---|
| JP | 2001-045225 | 2/2001 |
| JP | 2002-281240 | 9/2002 |

* cited by examiner

*Primary Examiner*—Renee Luebke
*Assistant Examiner*—Gunyoung T Lee
(74) *Attorney, Agent, or Firm*—Fulbright & Jaworski LLP

(57) ABSTRACT

A light source unit includes a substrate mounting a plurality of light emitting diodes (LED's) for irradiating beam to an object. The substrate is formed of a material having high heat conductivity and the unit includes a chip resistor mounted on the substrate and heat generation controller for heating the substrate with heat generated in the chip resistor upon supply of power to the chip resistor. The plural LED's are arranged in the form of an array on the substrate and a plurality of the chip resistors are arranged linearly along the array of LED's.

5 Claims, 13 Drawing Sheets

LIGHT SOURCE UNIT

BACKGROUND OF THE INVENTION

1. Field of the Invention

The present invention relates to a light source unit including a plurality of light emitting diodes (LED) for irradiating beam to an object. The invention relates also to a technique of controlling temperature of the light source area of such light source unit when the unit is employed in an apparatus, such as a film scanner, for obtaining image data.

2. Description of the Related Art

In the case of e.g. an image scanner section employed in a color copier for obtaining image data from an original document, according to the conventional image scanner section, an illuminating module using white LED's irradiates a beam on the document and the beam reflected from this document is then guided through mirrors, lenses to be impinged in focus on a 3-line sensor. This illuminating module includes a plurality of white LED's spaced apart with a predetermined distance therebetween and arranged linearly. A power supply system is provided for supplying power to the plurality of LED's from a PWM (pulse width modulation) control circuit. Further, a plurality of resistors acting as heat generating elements are provided adjacent the plural LED's. There is provided a further power supplying system for supplying power to the respective resistors from a different PWM control circuit than the above-mentioned PWM control circuit. These together make it possible to desirably set the light emission distribution of the LED in a main scanning direction and to desirably set also the heat generating amount of each of the plural resistors along the main scanning direction. In this conventional technique, there are also provided a plurality of temperature sensors disposed along the array of the LED's so that the plural resistors may be controlled respectively, based on result of detection by these temperature sensors. For this type of conventional technique, reference is made to e.g. Japanese Patent Application "Kokai" No.: Hei. 2002-281240 (paragraphs [0029]–[0033], paragraphs [0068]–[0072], and FIG. 10) ("Document 1" hereinafter).

A further type of conventional technique is known from Japanese Patent Application "Kokai" No.: Hei. 2001-45225 (paragraphs [0038]–[0051] and FIG. 3) ("Document 2" hereinafter), though this document does not describe control of light source temperature. This document discloses a film scanner including a light source comprising LED's and adapted for obtaining image data from a photographic film. In this, a plurality of LED chips for emitting rays of R (red), G (green), B (blue) and IR (infrared) are mounted in correspondence with each of the colors on an aluminum substrate. The rays from the LED's are guided via such optical components as a half mirror, a dichroic mirror, etc. onto the photographic film. The beam transmitting through the film is guided via a zooming lens to be impinged on an area-sensor type CCD sensor.

When a light source unit including LED's is employed in such scanner for obtaining color image, as described also in the afore-mentioned Document 1, i.e. Japanese Patent Application "Kokai" No.: Hei. 2002-281240, precision temperature control needs to be effected in order to maintain a predetermined amount of light from the respective LED's and also to maintain a predetermined light emission spectrum.

Then, in the case of the construction including a plurality of temperature sensors in correspondence with the LED's, in the technique of Document 1, the heat generating elements (resistors) are arranged in the vicinity of the LED's. In operation, the heat from each heat generating element is caused to affect each corresponding LED, thereby to maintain this LED at a target temperature. Therefore, for independent drive of each of the plural heat generating elements arranged along the array of the LED's (main scanning direction), the construction requires the PWM control circuit for controlling each heat generating element. This results in not only increased complexity of the circuit and physical enlargement of the entire apparatus, but also in cost increase due to the large number of components required. Especially if the heat from the heat generating element is caused to affect the LED, though not contemplated or described in Document 1, it will be needed to take into consideration such factors as radiation of heat from the heat generating element, conduction of heat through the atmosphere, conduction of heat from the heat generating element through the substrate on which the element is mounted. Then, when the heat generation amount from the heat generating element is adjusted, there will occur a certain delay in the effective transmission of this to the LED.

On the other hand, if other type of light source such as a halogen lamp, a xenon lamp is employed as the light source unit for use in obtaining color image data, this tends to invite some non-uniformity in the color temperature and/or heat generation. In order to avoid these inconveniences, Document 2 has confirmed the usefulness of the use of at least three kinds of LED's as the light source unit for irradiating the red, green and blue beams. In particular, in the case of an apparatus, such as a film scanner, which needs to obtain beam of each wavelength with high precision over a relatively wide range of visible light, it is desired that the apparatus can achieve no non-uniformity in the amounts of light and appropriate color temperature over the entire visible light range. However, the solution proposed by Document 2, i.e. Japanese Patent Application "Kokai" No.: Hei. 2001-45225, requires the heat generating elements for the temperature control and the PMW control circuits for controlling these elements respectively. Hence, it will be understood that this solution is not practical or insufficient in terms of desirable compactness of the entire apparatus and cost reduction.

SUMMARY OF THE INVENTION

In view of the above-described state of the art, a primary object of the present invention is to provide a light source unit which allows precise temperature control of LED's with minimum number of components.

For accomplishing the above, in a light source unit including a substrate mounting a plurality of light emitting diodes (LED's) for irradiating beam to an object, according to the present invention, said substrate is formed of a material having high heat conductivity and the unit includes a chip resistor mounted on said substrate and heat generation controlling means for heating the substrate with heat generated in said chip resistor upon supply of power to the chip resistor.

With this light source unit of the invention, when power is supplied to the chip resistor, this chip resistor generates heat, which heat is then conducted through the substrate and eventually to the LED's mounted thereon. Namely, as the substrate is formed of a material having high heat conductivity, the heat generated from the chip resistor can heat the entire substrate uniformly and can maintain all of the LED's mounted on the substrate at a near desired temperature. As a result, with such limited number of components, it is still possible to maintain the plural LED's at a predetermined temperature with high precision, thereby to achieve uniformity in the light amounts and wavelengths of the beams along the main scanning direction. Moreover, as the chip resistor is less expensive and more compact than a sheet-like heat generating element, this may be disposed at a desired appropriate area on the substrate. Hence, such advantageous temperature control is made possible without inviting cost increase.

According to one preferred embodiment of the present invention, said plural LED's are arranged in the form of an array on the substrate and a plurality of said chip resistors are arranged linearly along the array of LED's. With this, the substrate receives heat from the plurality of chip resistors arranged in the form of array along the array of the LED's. Therefore, even when there occurs some localized discharge of heat on one end of the LED array, this polarization or localization in the temperature of the substrate can be solved by heat from the plurality of chip resistors. Consequently, temperature uniformity can be achieved in the direction of the LED array.

According to a further preferred embodiment of the present invention, said substrate includes a metal base, an insulating layer formed on the base, and a printed circuit formed on the top face of the insulating layer, a bonding wiring being provided between terminals of the printed circuit and the LED's and said chip resistors being solder-fixed to the terminals of the printed circuit. With this construction, the bonding wiring is provided for the LED's. Hence, it is possible to provide the plural LED's as a number of small LED chips. Moreover, as the chip resistors are solder-fixed to the terminals of the printed circuit, these chip resistors can be thermally coupled with the substrate over a large surface area, thereby to achieve even better heat conduction from the chip resistors to the substrate. Consequently, a large amount of light can be obtained form the number of LED's mounted on the substrate and also the heat form the chip resistors can be conducted in a very efficient manner to the LED's.

According to a still further preferred embodiment of the present invention, said plural LED's arranged in the array are adapted for irradiating at least three kinds of beam of red, green and blue. With the provision of these at least three kinds of LED's, the light source can be used in a scanner designed for obtaining color image data. Further, even when the three kinds of LED's are mounted on different substrates, the LED's on each of these different substrates can be maintained at a uniform temperature. As a result, the scanner using this light source unit will achieve improved performance in obtaining color image data.

According to a still further preferred embodiment of the present invention, the light source unit further comprises light emission controlling means for supplying power to the LED's and warm-up controlling means for supplying a predetermined maximum power to said light emission controlling means and said heat generation controlling means at the time of startup of the light source unit. With this, at the time of startup of the light source unit, a predetermined maximum power is supplied to the LED's and the chip resistors respectively, so that the substrate can be heated to the desired temperature speedily. Consequently, the light amount and the wavelengths of the beams from the light source unit can be stabilized within a short period of time.

According to a still further preferred embodiment of the present invention, the light source unit further comprises temperature determining means for determining a temperature of the substrate, a radiator thermally coupled with the substrate and a fan for feeding cooling air to the radiator, and fan controlling means operable to drive said fan when the temperature of the substrate determined by said temperature determining means has exceeded a predetermined target temperature range and operable also to stop said fan when the determined temperature falls below said target temperature range. With this construction, when the temperature of the substrate determined by the temperature determining means has exceeded the target temperature range, the fan is driven for discharging the heat from the substrate through the radiator. Whereas, when the temperature of the substrate determined by the temperature determining means falls below the target temperature range, the fan is stopped to allow the temperature of the substrate to rise further. That is to say, with this construction, the temperature control is made possible simply by ON/OFF control of the fan, eliminating necessity of providing any special circuit for controlling the power to the chip resistors. As a result, this construction does not require any complicated control circuit and can still maintain the temperature of the LED's within the target temperature range through such simple control scheme.

According to a still further preferred embodiment of the present invention, said temperature determining means comprises a thermistor mounted on the substrate adjacent the LED. In this case, the temperature of the substrate is determined by the thermistor which is disposed in the vicinity of the LED. As a result, the temperature of the LED can be maintained with high precision.

Further and other features and advantages of the invention will become apparent upon reading the following detailed disclosure of preferred embodiments with reference to the accompanying drawings.

DESCRIPTION OF THE PREFERRED EMBODIMENTS

Preferred embodiments of the present invention will be described with reference to the accompanying drawings.

[General Construction]

Figure 1:
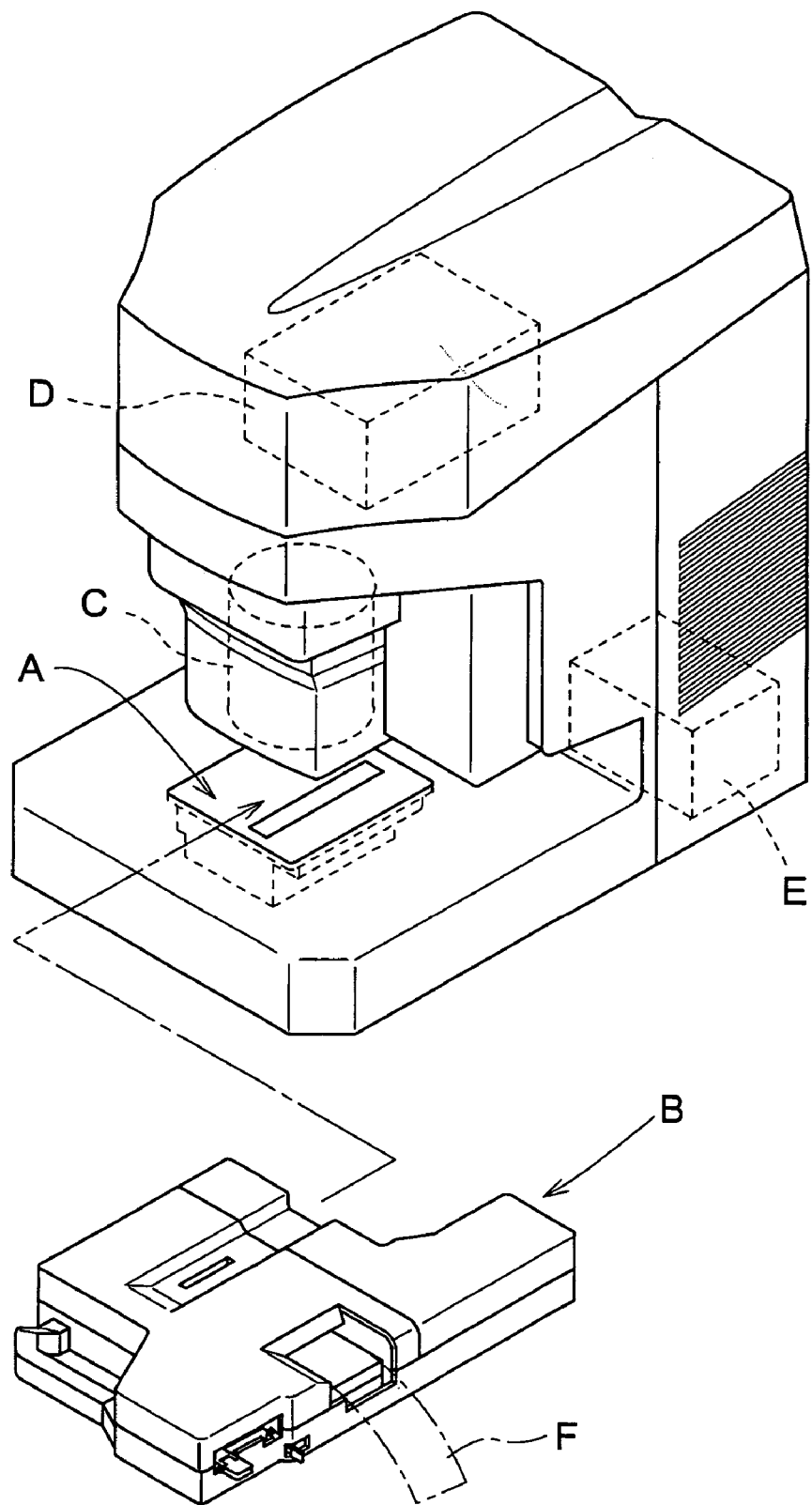
FIG. 1 is an overall perspective view of a film scanner.
Figure 2:
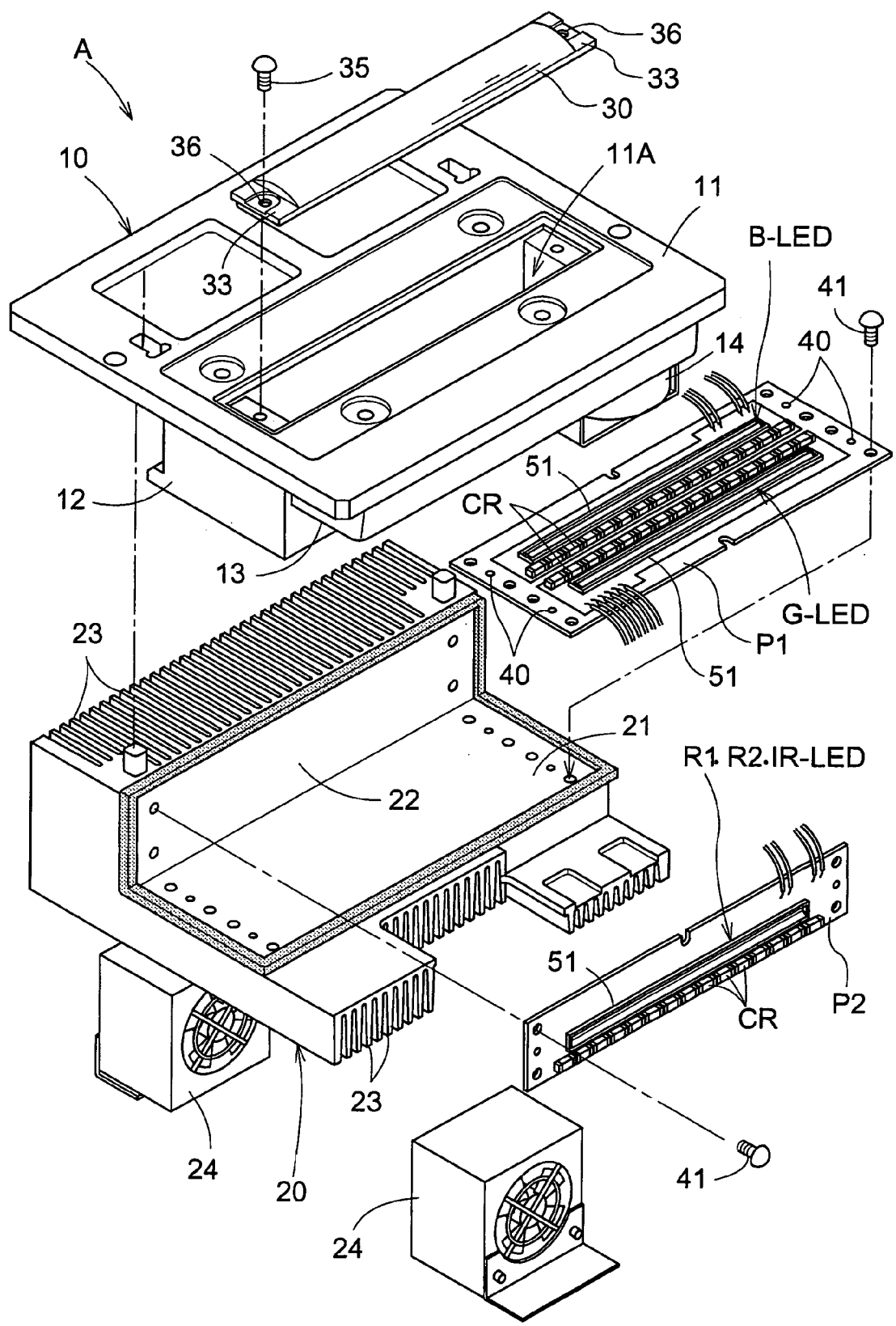
FIG. 2 is an exploded perspective view of a light source unit.
Figure 3:
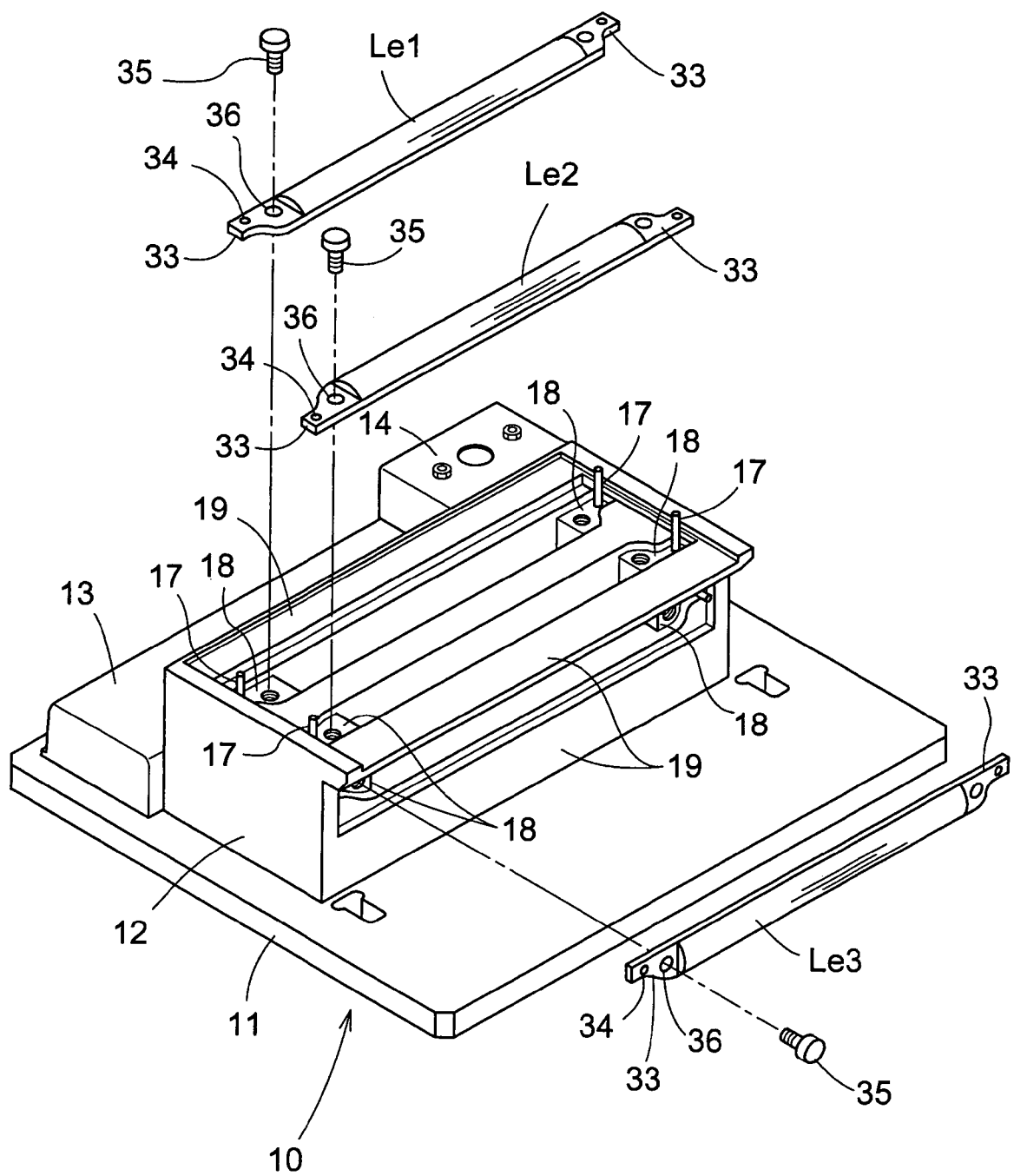
FIG. 3 is a perspective view showing a construction of supporting lenses to an upper case.

As shown in FIG. 1, a film scanner includes a light source unit A, a film carrier unit B, a lens unit C, a photoelectric converter unit D, and a control unit E.

In operation of this film scanner, a beam from the light source unit A is irradiated on a developed photographic film F carried on the film carrier B and the transmission beam past this photographic film F is guided by the lens unit C to the photoelectric converter unit D. In this converter unit D, a CCD (Charge Coupled Device) type line sensor incorporated therein obtains, from an image in the photographic film F, image data in the form of digital signals corresponding to the three primary colors of R (red), G (green) and B (blue) and obtains also, by means of an infrared beam (IR), its beam intensity variable due to presence of a defect or flaw or dust or the like in the photographic film F as image data in the form of digital signals for use in film defect correction. Further, the image data and the image-defect data thus obtained are stored in a storage means incorporated in the control unit E. Thereafter, the control unit E outputs the image data of the photographic film F by frame-by-frame basis and, when needed, corrects the image data based on the image-defect data.

The light source unit A includes a plurality of light-emitting diode (LED) arrays (representing three kinds of LED arrays described later. See FIG. 11) each comprising an array of a plurality of LED elements (LED's) 9 arranged along a main scanning direction for generating the beams of the three visible primary color components and the infrared beam. So that, the unit functions to emit beams from this LED array. The film carrier unit B is designed for transporting the film F back and forth along a sub scanning direction. And, a plurality of film carrier units B are prepared to cope with a plurality of types of photographic films F such as 135 size, 240 size, 120/220 size films, so that these carriers are exchangeable. The lens unit C includes a zooming type optical lens which is operable to cause an image in the photographic film F carried by the film carrier B to be impinged in focus on a photoelectric converting face of a CCD type line sensor incorporated in the photoelectric converter unit D, the lens allowing variation of a magnifying power depending on the desired number of pixels to be obtained. The photoelectric converter unit D includes a three-line type CCD line sensor corresponding to the three primary colors of R (red), G (green) and B (blue) and a one-line type CCD line sensor having sensitivity for the infrared beam (IR).

Though not shown, the control unit E includes a microprocessor, the storage means comprising a large-capacity hard disc, a semiconductor memory etc, and an interface for realizing signal access. The control unit E stores therein a program for controlling the all of the light source unit A, the film carrier unit B, the lens unit C, and the photoelectric converter unit D. This program realizes a control process (to be described later) for controlling the light amount and temperature of the light source unit A, a further process for controlling transportation of the photographic film F by the film carrier unit B for a scanning operation of the photographic film F, a still further process for setting a focal length of the zooming lens of the lens unit D in accordance with a type of the film F employed and/or the type of its scanning operation to be effected, a still further process for storing the image data from the photoelectric converter unit C in the manner described above and a still further process for correcting, when necessary, the image data thus stored based on the image-defect data.

[Light Source Unit]

As shown in FIGS. 2 through 6, the light source unit A includes an upper case 10 formed as resin molded component and a lower case 20 formed of an aluminum alloy. The upper case 10 includes a flat upper table portion 11 and a box portion 12 formed integrally therewith and projecting from the bottom face of the upper table portion 11. Further, a resin cover 13 is provided for a bottom face of the upper table portion 11. The lower case 20 includes a bottom wall portion 21, a lateral wall portion 22 formed integrally therewith and a plurality of fins 23 as heat radiator elements formed integrally with respective outer faces of the bottom wall portion 21 and the lateral wall portion 22. This light source unit A further includes a pair of fans 24 for feeding cooling air to the fins 23.

The upper table portion 11 of the upper case 10 defines an opening 11A of a predetermined width formed along the main scanning direction for irradiating beam upwards. Within this opening 11A, there is provided a cylindrical condensing lens 30 and at a position below this condensing lens 30, there is provided an ND filter 31 movable into and out of the optical axis of the lens. More particularly, this ND filter 31 is mounted to be slidable between a condition (position) where the filter is located downwardly of the condensing lens 30 and a further condition where the filter is retracted inside the cover 13. For realizing this movement, the filter is operably connected with a crank mechanism 15 activated by a drive from an electromagnetic solenoid type electric actuator 14 mounted to the cover 13. In operation, when this ND filter 31 is located at the position below the main converging lens 30 for adjusting the CCD of the photoelectric converter unit D, the filter reduces the amount of beam from the light source unit A, thus appropriately adjusting the photoelectric converter unit D with an appropriate amount of beam.

Further, the box portion 12 accommodates therein a first mirror M1 of dichroic type disposed at a lower position on an extension of the optical axis L of the condensing lens 30, a first lens Le1 of cylindrical type, a second mirror M2 of dichroic type disposed beside the first mirror M1, a second lens Le2 of cylindrical type for guiding beam to a reflecting side of the second mirror M2 and a third lens Le3 of cylindrical type for guiding the beam to a transmitting side of the second mirror M2.

Figure 4:
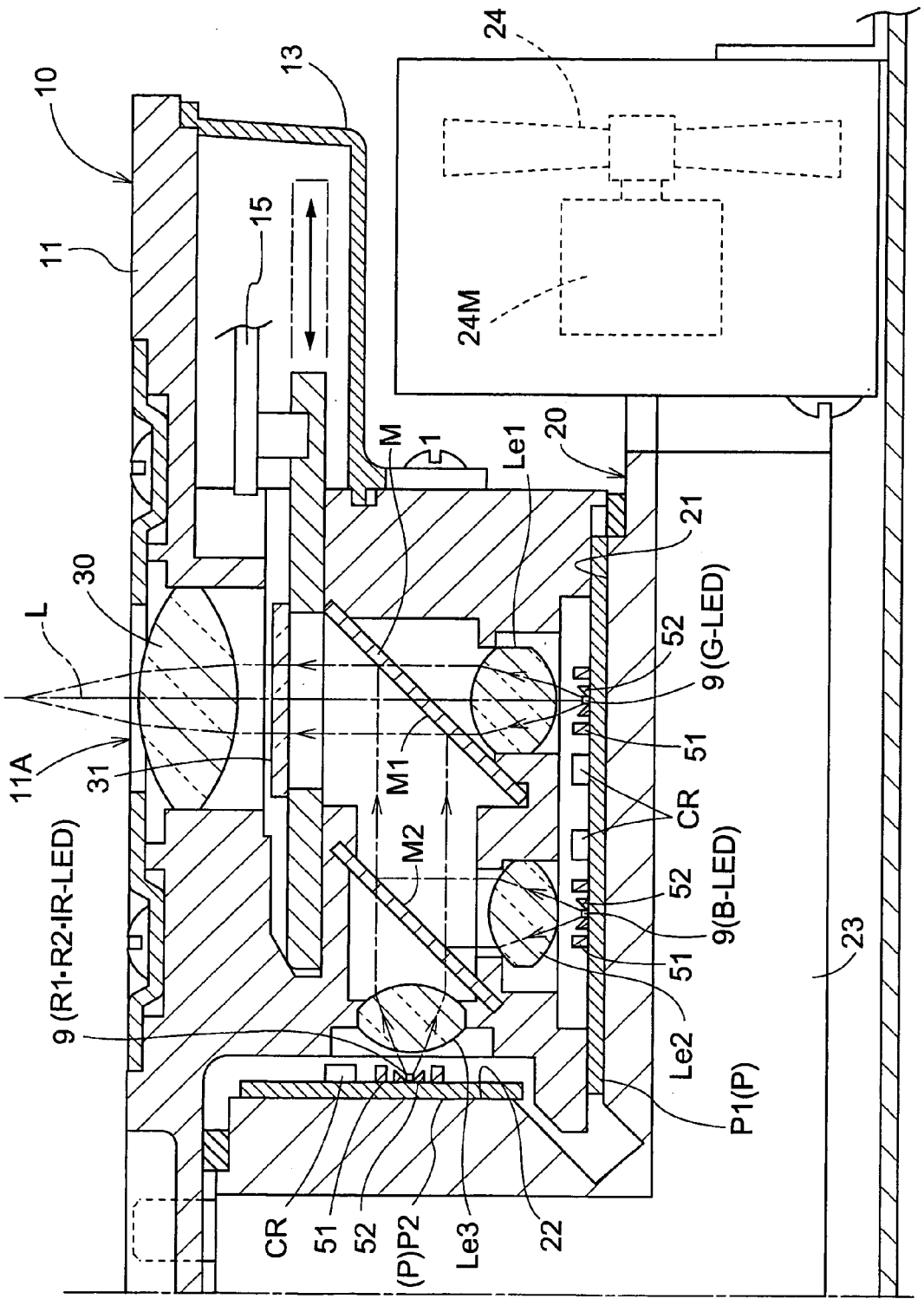
FIG. 4 is a front view in vertical section of the light source unit.
Figure 5:
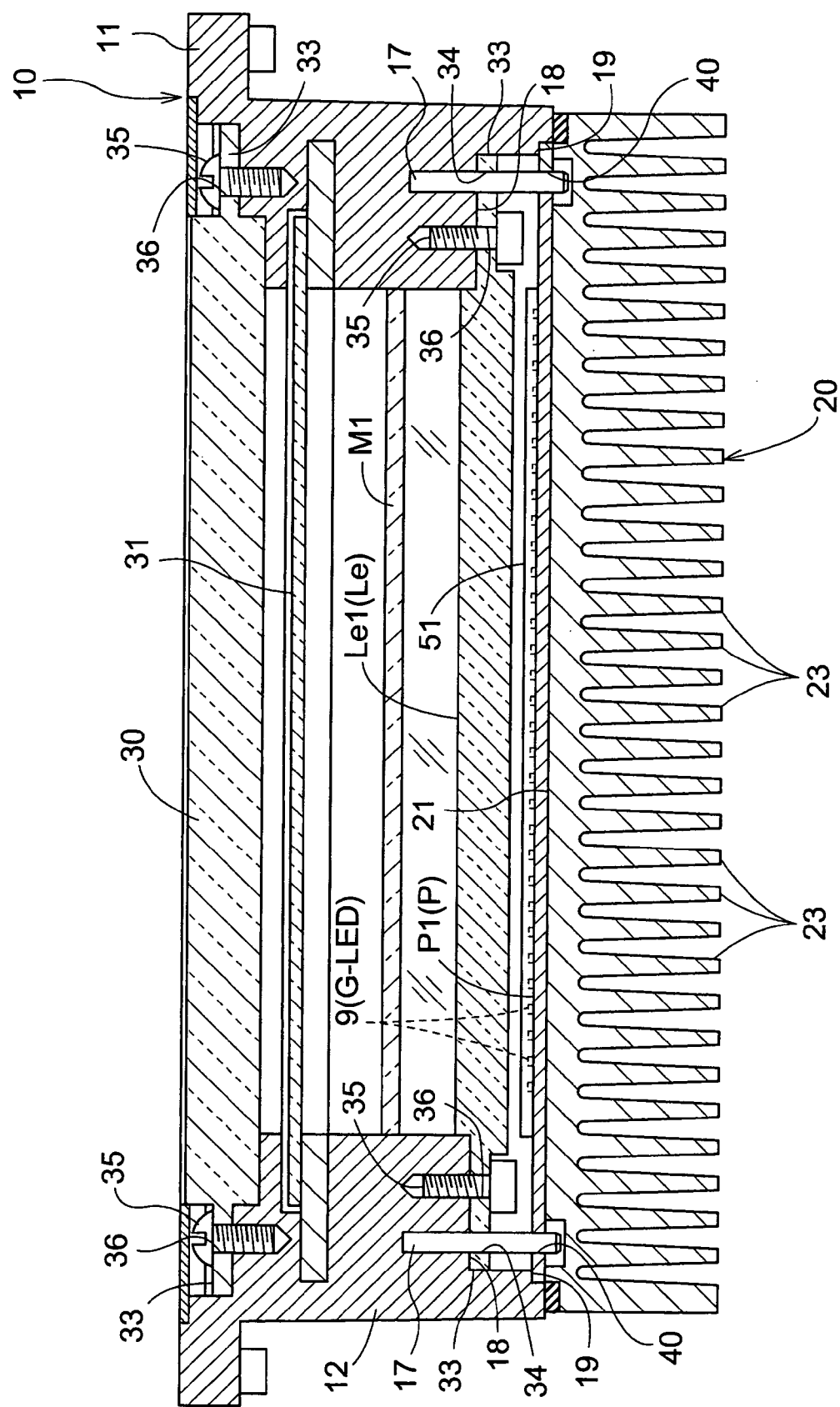
FIG. 5 is a section of the light source unit illustrating positional relationship between a condensing lens and a first lens.
Figure 6:
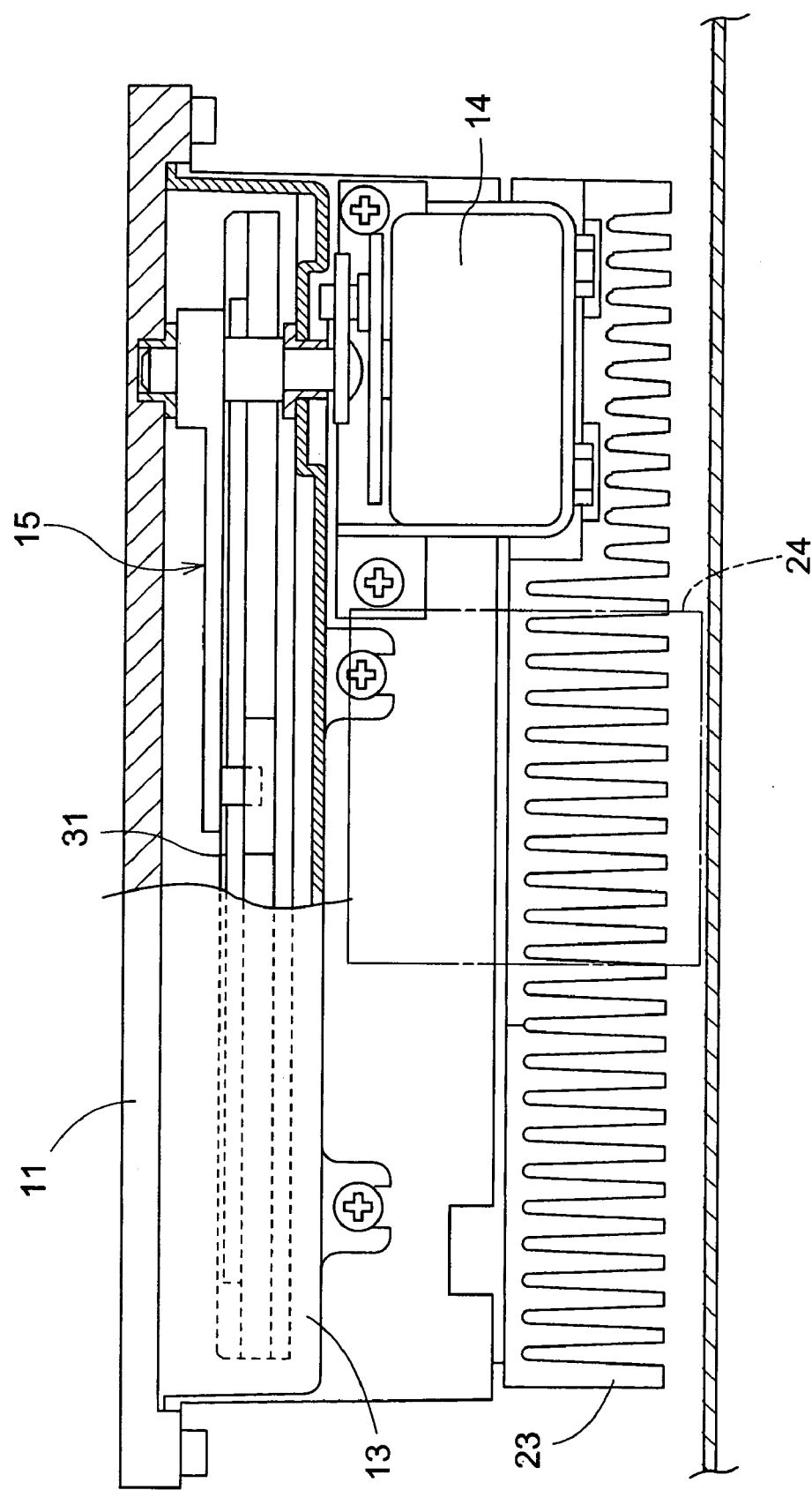
FIG. 6 is a partially cutaway side view illustrating coupling between an electric actuator and an ND filter.
Figure 7:
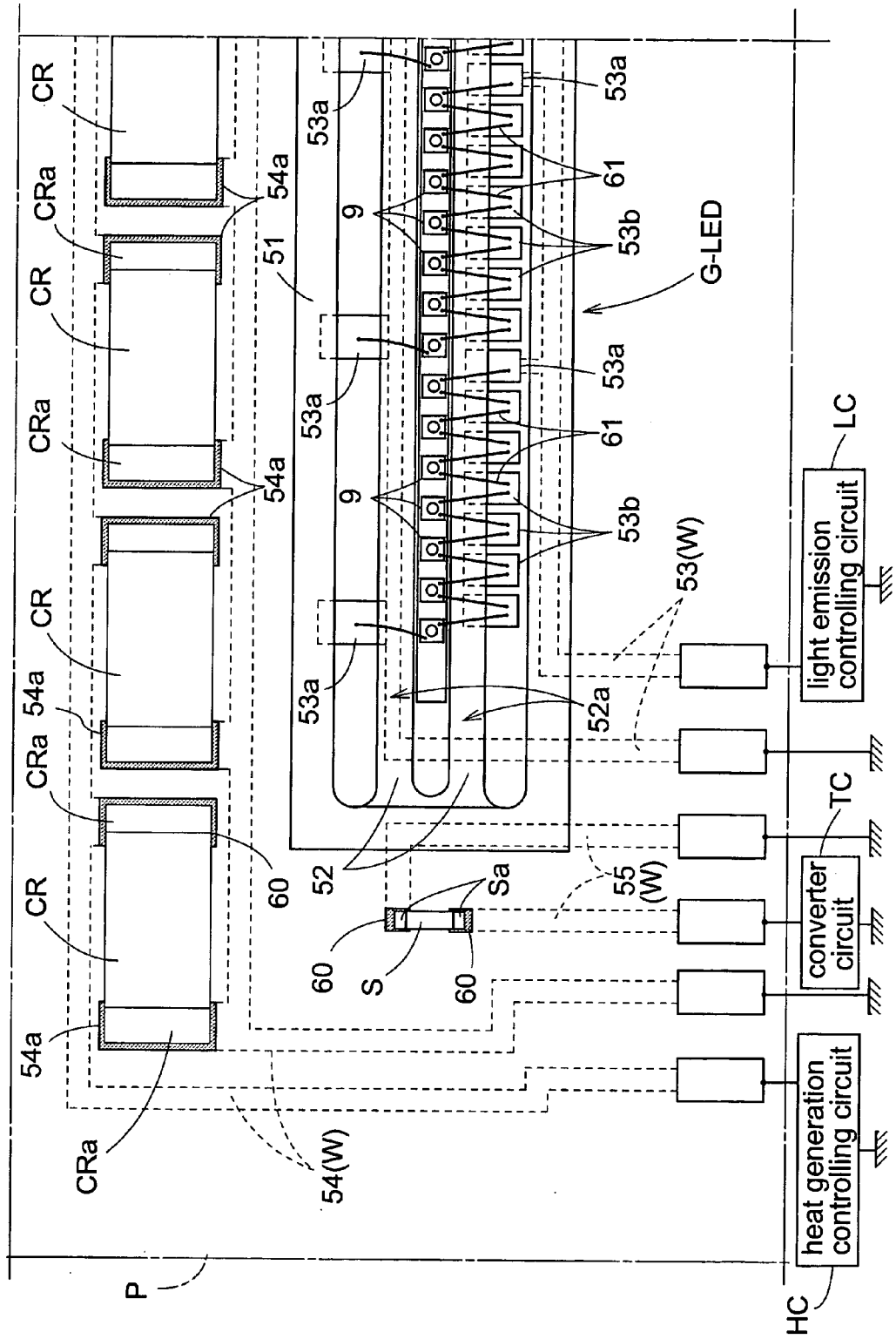
FIG. 7 is a top plan view showing a portion of a substrate.
Figure 8:
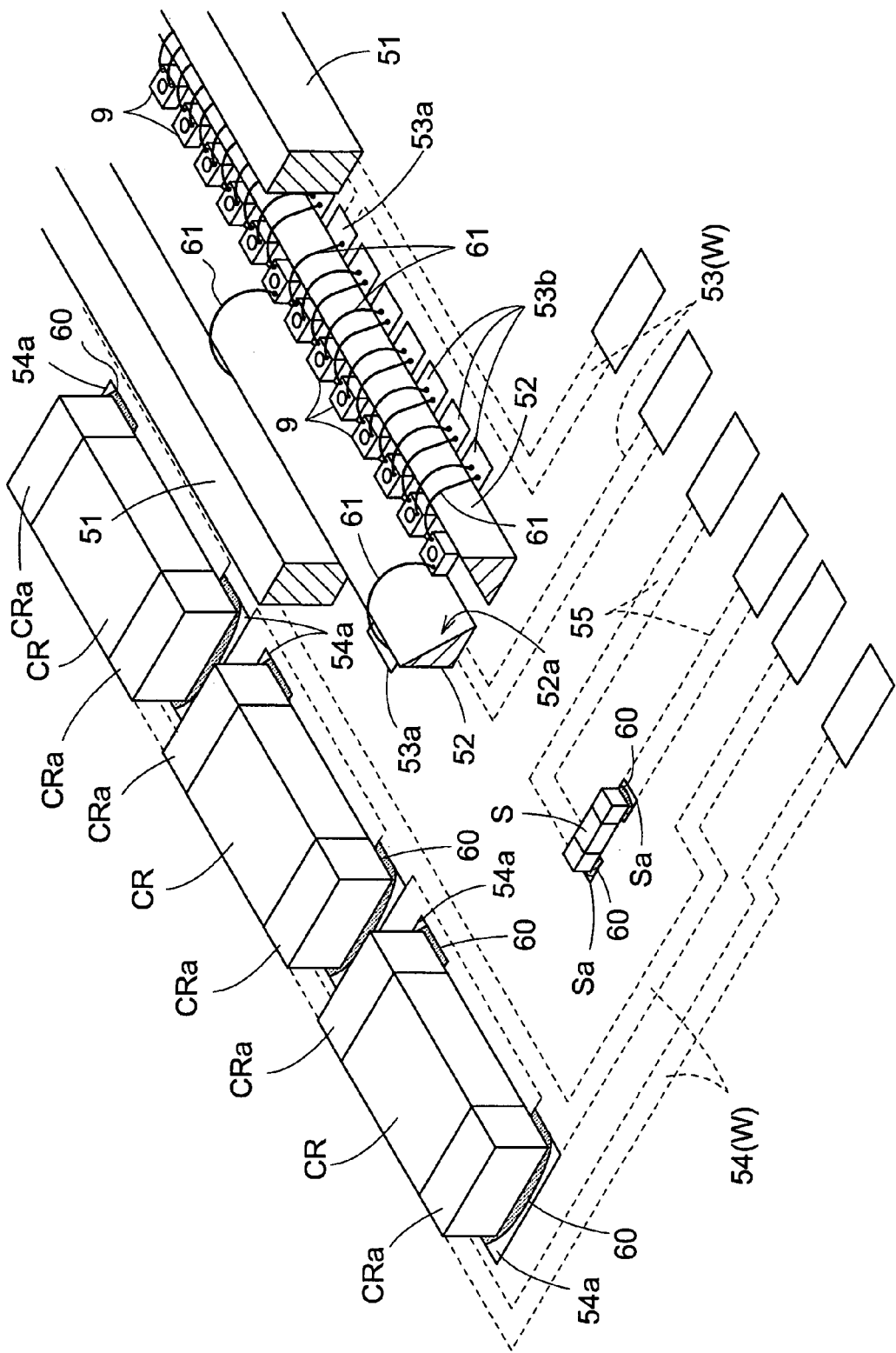
FIG. 8 is a perspective view showing components mounted on the substrate.
Figure 9:
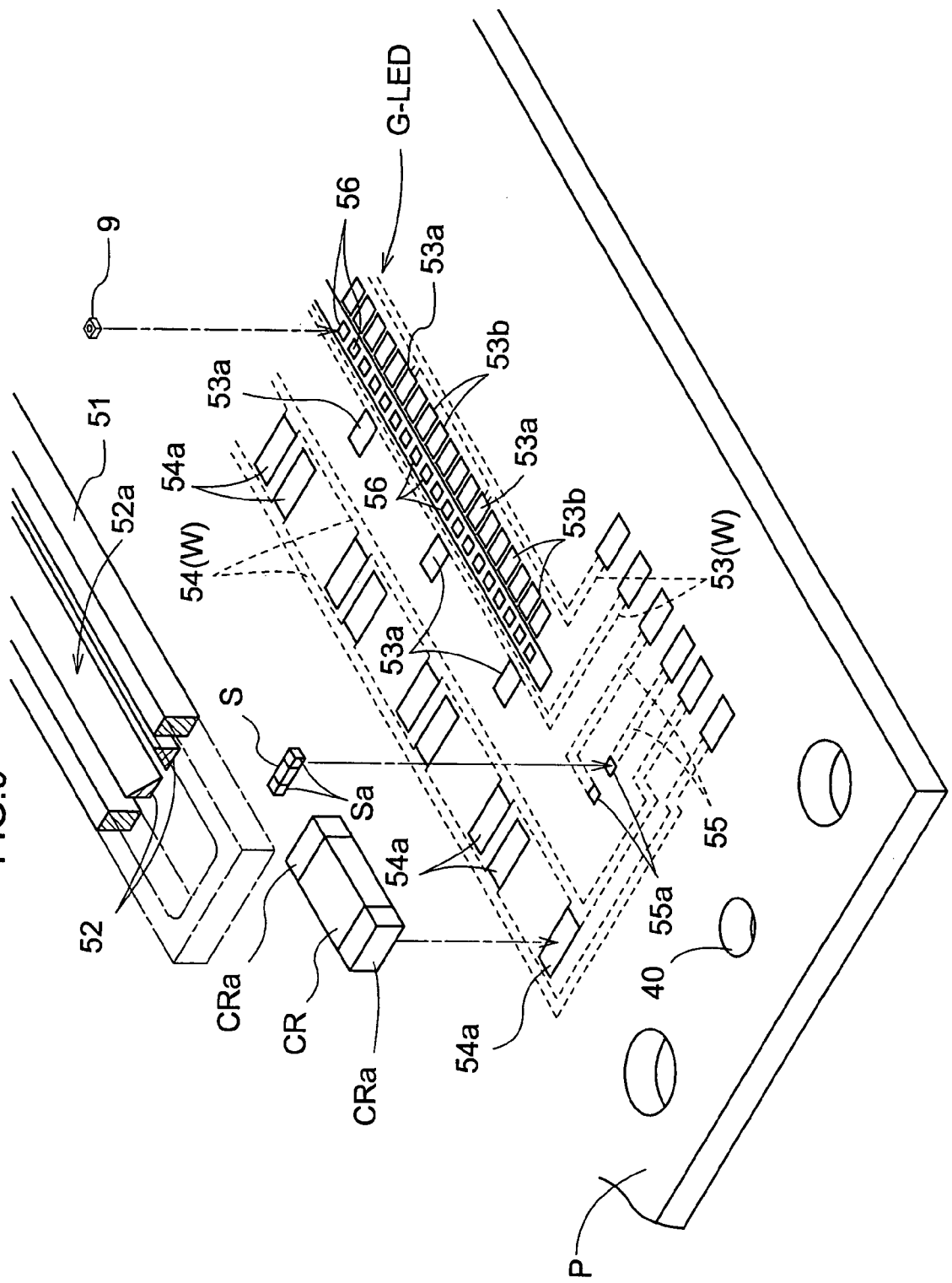
FIG. 9 is an exploded perspective view showing the substrate with the components mounted thereon.
Figure 10:
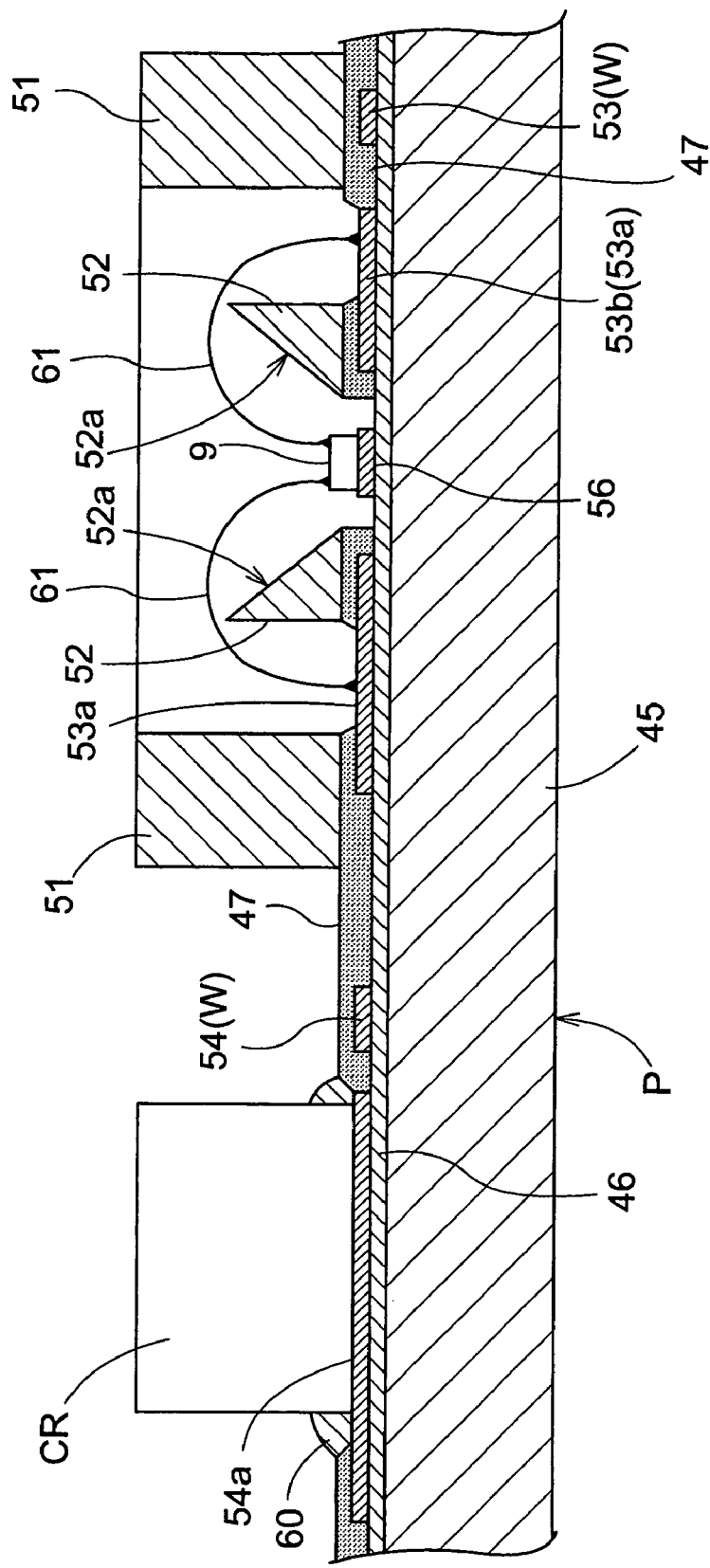
FIG. 10 is a section of the substrate showing its portion mounting LED's.

To the bottom wall portion 21 of the lower case 20, there is mounted a first printed circuit board (substrate) P1 mounting thereon a light-emitting diode array G-LED consisting of a plurality of chip-type green LED elements 9 linearly arranged along the main scanning direction and a light-emitting diode array B-LED consisting of a plurality of chip-type blue LED elements 9 linearly arranged along the main scanning direction. To the lateral wall portion 22 of the lower case 20, there is mounted a second printed, board (substrate) P2 mounting thereon a light-emitting diode array R1·R2·IR-LED including first red, second red and infrared beam LED elements 9 linearly arranged in the mentioned order along the main scanning direction. Then by assembling the lower case 20 with the upper case 10 by superposing the latter on the former, as shown in FIG. 4, the green LED array G-LED is disposed at the focal position of the first lens Le1, the blue LED array B-LED is disposed at the focal position of the second lens Le2 and the first red, second red and infrared LED array R1·R2·IR-LED is disposed at the focal position of the third lens Le3, respectively.

The green LED elements 9 have a wavelength of 400–480 nm, the blue LED elements 9 have a wavelength of 520–560 nm, and the first red LED elements 9 and the second red LED elements 9 have a combined wavelength of 620–750 nm, and the infrared LED elements 9 have a wavelength of 830–950 nm, respectively. The first mirror M1 transmits the beam of the particular wavelength (400–480 nm) from the green LED elements 9 while reflecting beams of any other wavelength. The second mirror M2 transmits the beams of the particular wavelengths (620–750 nm and 830–950 nm) from the first red, second red and infrared LED elements 9 while reflecting the beam from the blue LED elements 9 (520–560 nm).

With the above-described construction, the beams from the green LED array SLED are rendered into parallel rays through the first lens Le1 and then transmitted through the first mirror M1 to be guided to the condensing lens 30. The beams from the blue LED array B-LED are rendered into parallel rays through the second lens Le2 and reflected first by this second mirror M2 and then reflected by the first mirror M1 to be guided to the condensing lens 30. The beams from the first red, second red and infrared LED array R1·R2·IR-LED are rendered into parallel rays through the third lens Le3 and transmitted through the second mirror M2 and then reflected by the first mirror Ml to be guided to the condensing lens 20. By the function of the condensing lens 30, these rays are condensed at a desired scanning area of the photographic film F carried by the film carrier unit B.

In order to fixedly determine the focal position of the lens Le (referring generically to the three kinds of lenses described above) corresponding to the LED array LED (generically referring to the three kinds of LED arrays described above) mounted on the printed circuit board (substrate) P (generically referring to the first printed circuit board P1 and the second printed circuit board P2 described above), positioning pins 17 are provided erect from the box portion 12 of the upper case 10 and positioning faces 18 are formed for coming into contact with the lens Le. Further, at portions of the box portion 12 facing the bottom wall portion 21 and the lateral wall portion 22, there are formed reference faces 19 for coming into contact with the printed circuit board (substrate) P. At opposed ends of each lens Le (i.e. the first lens Le1, second lens Le2 or third lens Le3), there are integrally formed support pieces 33 for coming into contact with the positioning faces 18, pin holes 34 for engagement with the pins 17 and screw holes 36 through which fixing screws 35 are to be inserted. With the sole difference of not using the positioning pins 17, the construction for supporting the condensing lens 30 to the upper case 10 is identical to that for supporting the lenses Le to the box portion 12. Namely, the screws 35 will be inserted through the screw holes 36 formed in the support pieces 33 formed at the opposed ends of the condensing lens 30 and then the inserted screws will be fixedly threaded with the upper case 10.

The first printed circuit board P1 too defines pin holes 40 for engagement with the positioning pins 17. This first printed circuit board P1 will be fixed to the bottom wall portion 21 by means of screws 41 and the second printed circuit board P2 will be fixed in position to the lateral wall portion 22 by means of the screws 41. Incidentally, in mounting the first and second printed circuit boards P1, P2 to the bottom wall portion 21 and the lateral wall portion 22 respectively, silicon grease is applied to the interfaces thereof for improvement of heat conductivity.

With the above-described construction, when the first, second and third lenses Le1, Le2, Le3 are to be supported to the box portion 12, the pins 17 will be inserted into the pin holes 34 defined in the support pieces 33 formed at the opposed ends of each lens and then under this condition, the screws 35 inserted through the screw holes 36 will be fastened. In this manner, each lens Le1, Le2, Le3 can be supported to the box portion 12 with accuracy. Thereafter, the upper case 10 and the lower case 20 will be connected with each other with superposing the former on the latter. With this, the positioning pins 17 formed on the bottom face of the box portion 12 will engage into the corresponding pin holes 40 of the first printed circuit board P1 supported to the bottom wall portion 21, thereby to fixedly determine the position relative to the first printed circuit board P1 and fixedly determine also the position of the lower case 20 relative to the upper case 10 at the same time. As a result, the position of the third lens Le3 relative to the second printed circuit board P2 too will be fixedly determined as well.

[Substrate]

Next, the substrate (printed circuit board) P will be explained in details, by way of an example of its portion mounting the green LED array GLED.

As shown in FIGS. 7 through 11, the chip LED elements 9 are mounted on the substrate P and arranged linearly in the form of an array along the main scanning direction and along this array of the LED elements 9, there are provided a plurality of chip resistors CR. These chip resistors CR have a same resistance value and a same size and with supply of power thereto, and these resistors CR generate heat which is conducted to the substrate P, from which the heat is further conducted to the LED elements 9, so that the plural LED elements 9 may be maintained at an optimum temperature.

More particularly, the substrate P includes an aluminum base 45 as a material having a high heat conductivity, an insulating layer 46 formed on the base and a printed circuit W formed thereon and of a copper foil or a gold membrane. Further, on the upper face of this printed circuit W, there is formed a resist film 47 formed of an insulating resin (see FIG. 10). Further, this substrate P includes a reflector 52 formed integral with a rectangular frame member 51, the reflector 52 being disposed parallel with the LED array (main scanning direction) and fixed in the vicinity of the LED elements 9. Incidentally, the base 45 may be formed also of a copper plate or metal alloy, instead of aluminum. Also, the reflector 52 includes a reflecting face 52a inclined on the side facing the LED elements 9, so that this reflecting face 52a reflects the beam from the LED elements 9 in the direction normal to the substrate P. The frame member 51 and the reflector 52 are formed of liquid crystalline polymer having a high heat resistance.

The printed circuit W includes a light-emitting wiring portion 53 for supplying power to the LED elements 9, a heating wiring portion 54 for supplying power to the chip resistors CR and a determining wiring portion 55 for applying a potential to a chip thermistor S acting as a temperature determining means. The LED array GLED includes a plurality of units of LED elements 9, each unit consisting of seven LED elements electrically serially connected to each other. In correspondence with portions mounting the respective LED elements 9, there are formed a plurality of mounting portions 56 formed of the same material as the printed circuit.

The light emitting wiring portion 53 includes power terminals 53a each supplying power to one unit of LED elements 9, and relay terminals 53b formed independently thereof along the array direction of the LED elements 9. The heating wiring portion 54 includes terminals 54a to be connected by solder 60 with opposed electrodes CRa of the chip resistors CR. Further, the determining wiring portion 55 includes terminals 55a which are connected by solder 60 with opposed electrodes Sa of the thermistor S.

For the above-described construction, the substrate P is manufactured by a following process. Namely, after the substrate having the printed circuit W and the resist film 47 formed thereon is fixed in position with the pin holes 40, the reflector 52 together with the frame member 51 is fixedly bonded on the substrate P and then the chip LED elements 9 are fixedly supported to the mounting portions 56 of the substrate P linearly with the predetermined distance by means of die bonding.

Next, a bonding wiring 61 is formed between pad portions of the chip LED elements 9 and the power terminals 53*a* and also between pad portions of the LED elements 9 and the relay terminals 53*b*, and the chip resistors CR are disposed between the respective terminals 54*a* of the heating wiring portion 54, and the terminals 54*a* and the electrodes CRa of the chip resistors CR are fixed by the solder 60. Further, the thermistor S is disposed between the terminals 55*a* of the determining wiring portion 55, and the terminals 55*a* and the electrodes Sa of the thermistor S are fixed by the solder 60. This thermistor S is disposed in the vicinity of the LED elements 9. In particular, it is preferred that the thermistor S be disposed within a distance of 1 mm or less from the LED elements 9. With such arrangement adjacent the LED, it becomes possible to obtain temperature information reflecting the temperature of the LED elements 9.

In the above, the step of fixing the frame member 51 to the substrate P and the step of fixing the LED elements 9 to the substrate P by the die bonding may be carried out in a reverse order. These steps and the further step of forming the bonding wirings 61 between the chip LED elements 9 and the power terminals 53*a* and between the LED elements 9 and the relay terminals 53*b* are carried out with utilizing the pin holes 40 as reference, thus achieving high precision. Incidentally, when the bonding wirings 61 are formed, the process effects a step of specifying the positions of the power terminals 53*a* and the relay terminals 53*b* through an image processing using e.g. CCD. In this, the use of the pin holes 40 serves to further improve the die bonding and wire bonding performances, whereby the operation for specifying the positions may be completed in a shorter period of time.

Figure 11:
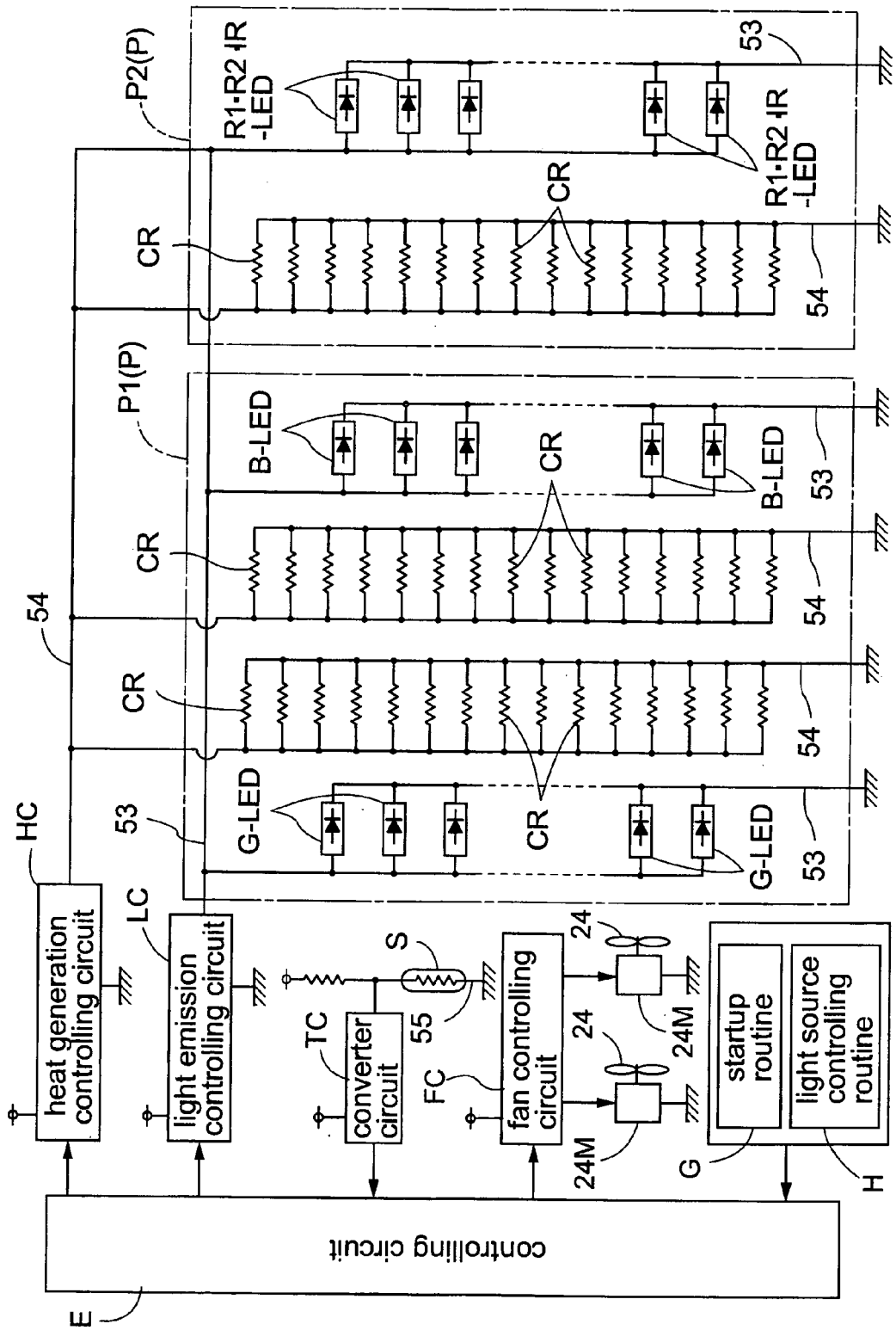
FIG. 11 is a circuit block diagram of a control unit for the light source unit.

As shown in FIG. 11, this film scanner includes a light emission controlling circuit LC acting as light emission controlling means for supplying power to the plurality of LED elements 9, a heat generation controlling circuit HC acting as heat generation controlling means for supplying power to the chip resistors CR, a fan controlling circuit FC for supplying power to a motor 24M of each of the fans 24, and a converter circuit TC for converting a voltage signal from the thermistor S to a temperature signal. These circuits, i.e. the light emission controlling circuit LC, the heat generation controlling circuit HC and the fan controlling circuit FC are controlled by control signals from the control unit E, whereas the converter circuit TC feedbacks the temperature signal to the control unit E. Incidentally, FIG. 11 shows each of the three kinds of the LED arrays: G-LED, B-LED, R1·R2·IR-LED as one light emitting unit block since each of these includes the unit of seven LED elements 9 serially connected to each other as described above.

The light emission controlling circuit LC and the heat generation controlling circuit HC each includes a PWM type power control circuit, so that with a duty ratio setting of the power control circuit, each circuit LC, HC can be switched over between a condition for supplying power and a condition for stopping the power supply. The fan controlling circuit FC includes power transistors, relays etc. so that this circuit can be switched over between a condition for supplying power to the motor 24M of the fan 24 and a condition for stopping the power supply thereto. The converter circuit TC includes an amplifier having an input with a high impedance and an A/D converter so as to convert the voltage signal from the thermistor S into a digital signal and then output this digital signal.

[Control by Control Unit]

The control unit E includes the microprocessor for controlling the above-described components as well as the electric actuator 14 for controlling the ND filter 31, the film carrier B and the lens unit C, and the interface for realizing access of the control signals, and the unit stores therein the programs for obtaining image data from the photographic film F set to the film carrier unit B. In particular, the control unit E employed by the present invention stores therein in the form of programs a startup routine G (an example of warm-up controlling means) which is executed immediately after supply of power to this film scanner and a light source controlling routine H (an example of fan controlling means) which is executed when the photographic film F is to be scanned.

Figure 12:
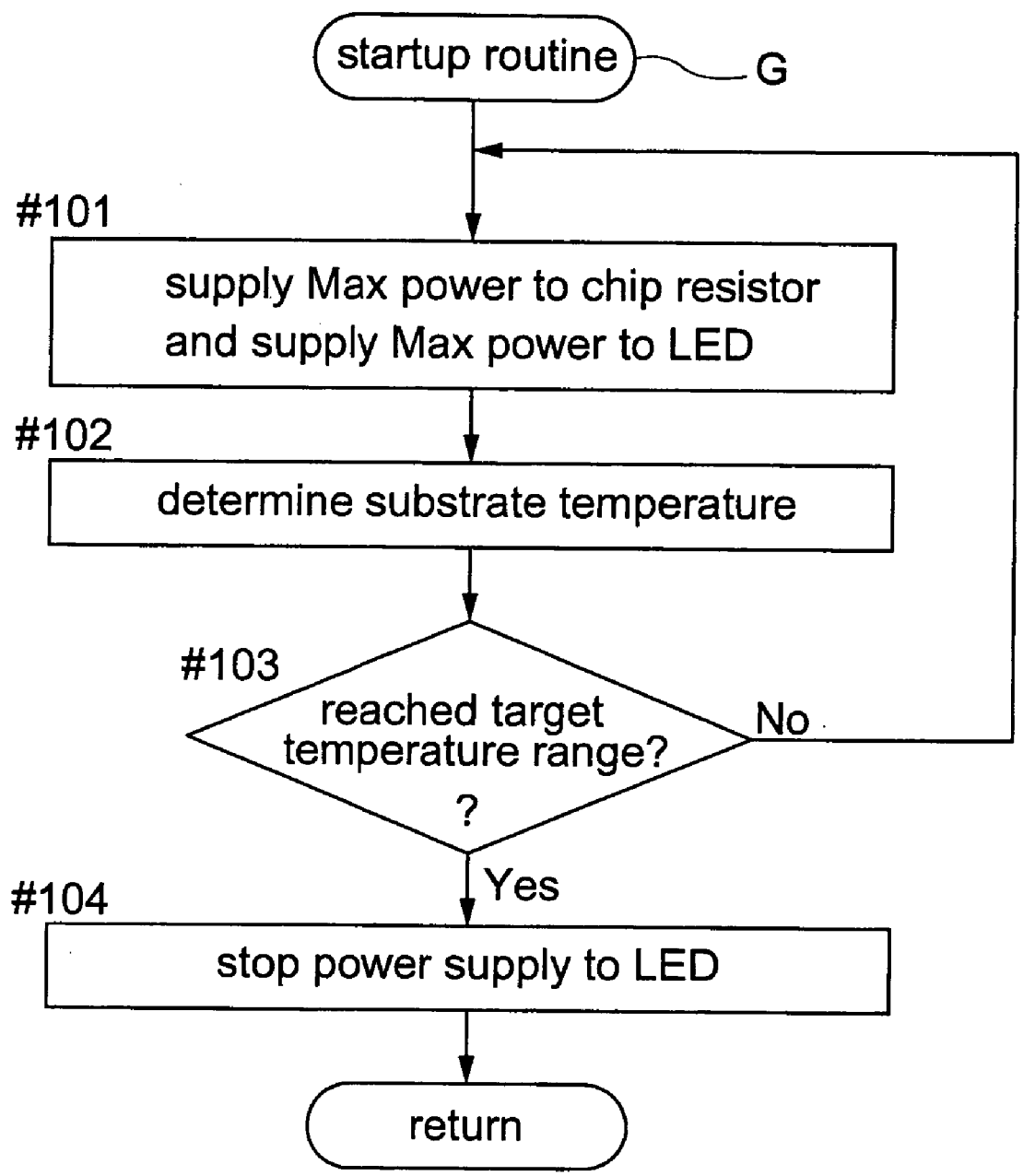
FIG. 12 is a flowchart of a startup routine.

More particularly, in the start-up routine G, as illustrated in the flowchart of FIG. 12, immediately after the power supply, maximum (Max) power is supplied to all of the chip resistors CR mounted on the substrate P and also maximum (Max) power is supplied to all of the LED elements 9 mounted on the substrate P. After these power supplies, when it is determined that the temperature of the substrate P determined by the thermistor S has reached a target temperature range, the power supply to all of the LED elements 9 is stopped (whereas the power supply to the chip resistors CR is continued), the process enters a standby condition (steps #101–104). In this film scanner, the target temperature is set so as to maintain the temperature of the LED elements 9 at 45° C. when effecting the scanning operation. Further, using this target temperature (45° C.) as the reference, threshold values (45.5° C., 44.5° C.) are respectively set on the 0.5° C. higher side and on the 0.5° C. lower side relative thereto. Then, when the temperature of the substrate P determined by the thermistor S has exceeded the lower threshold value (44.5° C.), the power supply to the LED elements 9 is stopped.

With the above-described control scheme of the startup routine, when the film scanner is powered ON, with heat generated by the large powers supplied respectively to the LED elements 9 and the chip resistors CR, the substrate P is heated to the appropriate temperature in a short period of time, thereby to stabilize the light emissions from the LED elements 9, thus making the scanning of the photographic film F possible.

Figure 13:
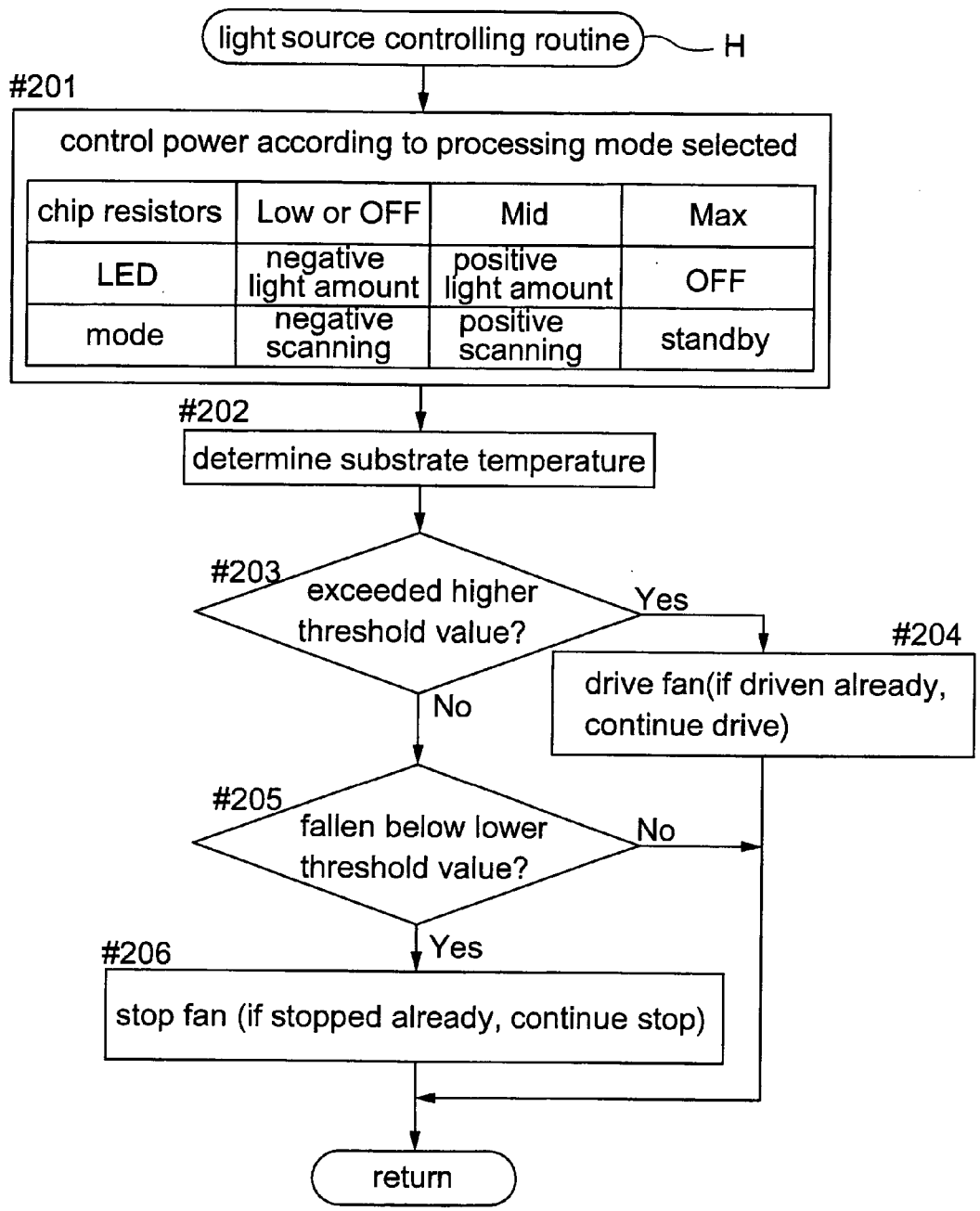
FIG. 13 is a flowchart of a light source control routine.

Also, in the light source controlling routine H, as illustrated in the flowchart of FIG. 13, the routine executes a process for controlling power in accordance with a selected processing mode (step #201). In this film scanner, there are set in advance three processing modes of a negative scanning mode for obtaining image data from a negative film, a positive scanning mode for obtaining image data from a positive film and a standby mode for not effecting any scanning at all. In the negative scanning mode, low (Low) power or no power is supplied to the chip resistors CR. Under this condition, power is supplied to the LED elements 9 for obtaining light amount suitable for the negative film. Whereas, in the positive scanning mode, an intermediate (Mid) power is supplied to the chip resistors CR, and under this condition, power is supplied to the LED elements 9 for obtaining light amount suitable for the positive film. In the standby mode, the maximum (Max) power is supplied to the chip resistors CR, and under this condition, power supply to the LED elements 9 is stopped.

The light amount for the negative film is set greater than the light amount for the positive film. Therefore, for the light amount for the negative film, larger power is supplied to the LED elements 9 than that supplied thereto for obtaining the light amount for the positive film. Also, this light amount for the negative film is set to or near the maximum light amount value in accordance with the sensitivity of the CCD included in the photoelectric converter unit D. Hence, power corresponding to this light amount is supplied from the light emission controlling circuit LC and power inversely proportional thereto is supplied from the heat generation controlling circuit HC to the chip resistors CR or no power is supplied to the resistors CR. Since the light amount for the positive film is smaller than the light amount for the negative film, power corresponding thereto is supplied to the LED elements 9 from the light emission controlling circuit LC and at the same time power is supplied from the heat generation controlling circuit HC to the chip resistors CR.

According to the above-described control scheme, the heat generation amount combining the amount of heat generated by the power supplied to the LED elements 9 and the amount of heat generated by the power supplied to the chip resistors CR is set to be substantially equal in the respective processing modes. As a result, regardless of the processing mode selected, there will occur no variation in the temperature of the substrate P, thereby to reduce the frequency of driving the fans 24.

After the step #201, when the temperature of the substrate determined by the thermistor S has exceeded to the higher threshold value (45.5° C.), the driving of the fan 24 is initiated (when the fan 24 is being driven already, this driving is continued), and after this driving, when the temperature of the substrate determined by the thermistor S has fallen below the lower threshold value (44.5° C.), the driving of the fan 24 is stopped (if the fan 24 is stopped already, this stop condition is continued) (steps #202–206).

That is to say, in this light source controlling routine H, regardless of the processing mode selected from the plurality of processing modes, the amount of heat generated on the substrate is maintained substantially constant. As a result, even when the processing mode is switched over, this will not invite such inconvenience as sharp rapid rise in the temperature of the substrate P and the frequency of driving the fan 24 can be reduced also.

As described above, according to the present invention, the substrate P employs the base 45 made of material having high heat conductivity and the plurality of LED elements 9 are mounted on this substrate P and arranged in the form of array along the main scanning direction. Further, along this array of the LED elements 9, there are arranged the plurality of relatively inexpensive chip resistors CR acting as heat source and fixed to the substrate by means of the solder 60. So that, the substrate P may be heated uniformly without temperature irregularity with the heat from the LED elements 9 and also the heat from the chip resistors CR, so that the LED elements 9 are maintained at the target temperature range for providing the beams of required wavelengths.

Further, for the startup of this film scanner, the LED elements 9 can be heated to the optimum temperature in a short period time, thereby to allow a scanning operation to be started speedily. Further, once the temperature has reached the optimum value, even when the light amount is to be changed in accordance with the type of the photographic film F or when no scanning operation is to be effected in the standby condition, the temperature of the substrate P can be maintained only by varying the heat generation amount from the chip resistors CR. Especially, in the event of change in the temperature of the substrate P, the temperature control scheme is executed only by means of the control of the fans 24 with reference to the higher threshold value and the lower threshold value. Therefore, this construction does not require such complicated control scheme as stepless change of the power to be supplied to the chip resistors CR through change in the duty ratio of the PWM control. Instead, the construction can maintain the entire LED arrays at an appropriate temperature by the simple and easy control schemes described above.

[Other Embodiment]

In addition to the foregoing embodiment, the light source unit of the invention may be employed also as a light source for use in an electrostatic copier, a flat bed scanner, etc.

The present invention may be embodied in any other manner than described above. Various modifications thereof will be apparent for those skilled in the art without departing from the essential concept thereof defined in the appended claims.

The invention claimed is:

1. A light source unit comprising:
   a substrate formed of a material having high heat conductivity;
   a light emitting diode (LED) group comprising a plurality of light emitting diodes mounted on the substrate for irradiating beam to an object;
   a chip resistor group comprising a plurality of chip resistors mounted on said substrate in the same direction as said LED group;
   a light emission controlling circuit for supplying power for light emission to the LED group so as to heat said substrate with heat generated simultaneously with light emission from said LED group;
   a heat generation controlling circuit for supplying power for heat generation to said chip resistor group so as to heat the substrate with heat generated in said chip resistor group;
   temperature determining means in the form of a chip mounted on said substrate for determining a temperature of said substrate; and
   a control unit for determining the amount of power to be supplied for light emission to said LED group by said light emission controlling circuit and for determining the amount of power to be supplied for heat generation to said chip resistor group by said heat generation controlling circuit;
   wherein said control unit comprises a warm-up controlling unit for warming up said LED group, and a light source controlling unit for enabling said LED group to scan said object; and
   wherein said warm-up controlling unit operable to provide a command to supply the maximum power for light emission said light emission controlling circuit and is operable to provide command to supply the maximum power for heat generation until the temperature of the substrate as determined by said temperature determining means reaches a predeterminined threshold.

2. The light source unit according to claim 1, wherein said substrate includes a metal base, an insulating layer formed on the base, and a printed circuit formed on the top face of the insulating layer, a bonding wiring being provided between terminals of the printed circuit and the LED's and said chip resistors being solder-fixed to the terminals of the printed circuit.

3. The light source according to claim 1, wherein said plural LED's are adapted for irradiating at least three kinds of beam of red, green and blue.

4. The light source unit according to claim 1, further comprising radiator thermally coupled with the substrate and a fan for feeding cooling air to the radiator and fan controlling means operable to drive said fan when the temperature of the substrate determined by said temperature determining means has exceeded a predetermined target temperature range and operable also to stop said fan when the determined temperature falls below said target temperature range.

5. The light source unit according to claim 1, wherein said temperature determining means comprises a thermistor mounted on the substrate adjacent the LED.

* * * * *